(12) United States Patent
Van Lankvelt et al.

(10) Patent No.: US 10,782,620 B2
(45) Date of Patent: Sep. 22, 2020

(54) VIBRATION ISOLATION DEVICE, LITHOGRAPHIC APPARATUS AND METHOD TO TUNE A VIBRATION ISOLATION DEVICE

(71) Applicant: ASML NETHERLANDS B.V., Veldhoven (NL)

(72) Inventors: Alexander Petrus Josephus Van Lankvelt, Veghel (NL); Olav Johannes Seijger, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/774,893

(22) PCT Filed: Nov. 3, 2016

(86) PCT No.: PCT/EP2016/076488
§ 371 (c)(1),
(2) Date: May 9, 2018

(87) PCT Pub. No.: WO2017/089085
PCT Pub. Date: Jun. 1, 2017

(65) Prior Publication Data
US 2018/0328434 A1    Nov. 15, 2018

(30) Foreign Application Priority Data
Nov. 23, 2015    (EP) ..................................... 15195756

(51) Int. Cl.
*G03B 27/68*    (2006.01)
*G03F 7/20*    (2006.01)
(Continued)

(52) U.S. Cl.
CPC ............... *G03F 7/709* (2013.01); *F03G 3/06* (2013.01); *F16F 7/1022* (2013.01); *F16F 15/04* (2013.01);
(Continued)

(58) Field of Classification Search
CPC . B25J 9/048; F03G 3/06; F16F 7/1022; F16F 15/0275; F16F 15/04;
(Continued)

(56) References Cited

U.S. PATENT DOCUMENTS 4,119,812 A    10/1978   Fox
5,310,157 A *   5/1994   Platus ..................... F16F 3/026
                                                          248/619

(Continued)

FOREIGN PATENT DOCUMENTS

CN    101382178 A    3/2009
CN    101 398 052 A    4/2009
(Continued)

OTHER PUBLICATIONS

PCT/EP2016/076488 International Search Report dated Feb. 23, 2017.
(Continued)

*Primary Examiner* — Christina A Riddle
(74) *Attorney, Agent, or Firm* — Sterne, Kessler, Goldstein & Fox P.L.L.C.

(57) ABSTRACT

The invention provides a vibration isolation device configured to support a structure, comprising:
an air mount having a base part mounted on a reference structure and a vibration isolated part, and
an inverted pendulum device, wherein a lower end of the inverted pendulum device is mounted on the vibration isolated part of the air mount and an upper end of the inverted pendulum device support the structure to be supported, (Continued)

wherein the vibration isolation device comprises a stiffness adjustment device configured to adjust the stiffness of the inverted pendulum device.

16 Claims, 5 Drawing Sheets

(51) Int. Cl.
F03G 3/06 (2006.01)
F16F 7/10 (2006.01)
F16F 15/04 (2006.01)

(52) U.S. Cl.
CPC ...... *G03F 7/70716* (2013.01); *G03F 7/70758* (2013.01); *G03F 7/70766* (2013.01); *G03F 7/70808* (2013.01); *G03F 7/70816* (2013.01); *G03F 7/70833* (2013.01); *F16F 2228/063* (2013.01); *F16F 2228/066* (2013.01)

(58) Field of Classification Search
CPC .......... F16F 2228/063; F16F 2228/066; G03F 7/70716; G03F 7/70725; G03F 7/70758; G03F 7/70766; G03F 7/708; G03F 7/70808; G03F 7/70816; G03F 7/70825; G03F 7/70833; G03F 7/709
USPC ............... 355/50, 52, 53, 54, 55, 63, 72–77; 248/636, 637, 638, 644, 645, 648, 660, 248/664, 669, 157, 419, 424, 463.1, 248/163.2, 188.1, 188.2, 317, 323, 324, 248/325, 327, 560, 562, 566, 550, 618, 248/559, 677; 74/574.2; 137/38, 45; 250/492.1, 492.2, 492.22, 493.1, 503.1; 269/20, 24, 55, 58, 71

See application file for complete search history.

(56) References Cited

U.S. PATENT DOCUMENTS

| | | | |
|---|---|---|---|
| 5,779,010 A | 7/1998 | Nelson | |
| 6,355,994 B1* | 3/2002 | Andeen | G03F 7/70716 248/550 |
| 7,417,711 B2 | 8/2008 | Jacobs et al. | |
| 8,256,735 B2 | 9/2012 | Heiland | |
| 8,767,172 B2 | 7/2014 | Ebihara et al. | |
| 2002/0021425 A1* | 2/2002 | Janssen | F16C 29/025 355/53 |
| 2002/0118346 A1 | 8/2002 | Galburt et al. | |
| 2002/0127050 A1 | 9/2002 | Andeen et al. | |
| 2003/0052247 A1 | 3/2003 | Yasuda et al. | |
| 2003/0090645 A1 | 5/2003 | Kato | |
| 2004/0140415 A1* | 7/2004 | Watson | F16F 15/0275 248/560 |
| 2004/0160585 A1 | 8/2004 | Jacobs et al. | |
| 2005/0018160 A1 | 1/2005 | Dams et al. | |
| 2007/0052946 A1 | 3/2007 | Heiland | |
| 2007/0108366 A1 | 5/2007 | Kim et al. | |
| 2008/0068568 A1 | 3/2008 | Ebihara et al. | |
| 2008/0235818 A1 | 9/2008 | Maggioni | |
| 2011/0001007 A1 | 1/2011 | Fox et al. | |
| 2014/0048989 A1 | 2/2014 | Platus et al. | |
| 2014/0374565 A1 | 12/2014 | Tan et al. | |

FOREIGN PATENT DOCUMENTS

| | | |
|---|---|---|
| CN | 101398052 A | 4/2009 |
| EP | 1 148 389 A2 | 10/2001 |
| JP | 62017441 A | 1/1987 |
| JP | H 04-034537 A | 2/1992 |
| JP | H 05-012791 B2 | 2/1993 |
| JP | 11002284 A | 1/1999 |
| JP | 2000-337439 A | 12/2000 |
| JP | 2002048191 A | 2/2002 |
| JP | 2003-120748 A | 4/2003 |
| JP | 2004-289115 A | 10/2004 |
| JP | 2007-024313 A | 2/2007 |
| JP | 2008-515219 A | 5/2008 |
| JP | H 07-310781 A | 9/2012 |
| KR | 20140055667 A | 5/2014 |
| WO | WO 91/02921 A1 | 3/1991 |
| WO | 04003306 A1 | 1/2004 |
| WO | 08115589 A1 | 9/2008 |

OTHER PUBLICATIONS

International Preliminary Report on Patentability and Written Opinion of the International Searching Authority directed to related International Patent Application No. PCT/EP2016/076488, dated May 29, 2018; 6 pages.

Ishizaki et al., "Dynamic Characteristics of an Inverted Pendulum Incorporated to the Seismic Attenuation System of TAMA300," 2010; pp. 1-13.

* cited by examiner

VIBRATION ISOLATION DEVICE, LITHOGRAPHIC APPARATUS AND METHOD TO TUNE A VIBRATION ISOLATION DEVICE

CROSS-REFERENCE TO RELATED APPLICATIONS

This application is the U.S. National Stage Application of International Patent Application No. PCT/EP2016/076488, filed on Nov. 3, 2016 which claims priority of EP application 15195756.0 which was filed on Nov. 23, 2015 both of which are incorporated herein in their entirety by reference.

BACKGROUND

Field of the Invention

The present invention relates to a vibration isolation device, a lithographic apparatus, and a method to tune a vibration isolation device.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a prior art lithographic apparatus, a projection system for projecting a patterned beam onto a target portion of the substrate is supported by and positioned relative to a structure, for example a metrology frame. The metrology frame is supported by and positioned relative to a base structure, for example a base frame.

Vibrations of the projection system may cause incorrect projections on the substrate rendering the substrate unusable. Therefore, any vibration of the projection system is to be prevented. The base frame however is coupled to the environment of the lithographic apparatus, such as a factory floor. The base frame passes any vibration of the environment on to any body rigidly coupled to the base frame.

In a prior art lithographic apparatus typically three vibration isolation devices are provided to prevent vibrations being passed from the base structure to a structure supported by the vibration isolation devices.

In a known embodiment of such prior art lithographic apparatus, each vibration isolation device comprises an air mount having a base part mounted on a base structure and a vibration isolated part. The air mount provides a pneumatic compliance in vertical direction (z-direction). The vibration isolation device further comprises an inverted pendulum device, wherein a lower end of the inverted pendulum device is mounted on the vibration isolated part of the air mount and an upper end of the inverted pendulum device to the structure to be supported. The inverted pendulum device is configured to provide compliance in direction in the horizontal plane (x-direction and y-direction) perpendicular to the vertical direction as well as in rotation directions about three orthogonal axes, i.e. rotation about the axes in x-direction, y-direction and z-direction.

The inverted pendulum device may comprise one or more pendulum rods to connect the vibration isolated part to the structure. The Eigen frequency in the horizontal plane is determined by the positive stiffness of the inverted pendulum device, for example the stiffness of elastic joints that are provided in the one or more pendulum rods, and the negative stiffness of the inverted pendulum device, i.e. the tendency of the inverted pendulum device to tilt over.

Usually the mass of the structure is supported by three vibration isolation devices to obtain a kinematic support. Ideally the mass on every vibration isolation device is ⅓th of the complete mass and inertias "seen" by the vibration isolation devices are exactly the same. In that case, and if all parts of the three vibration isolation devices are identical, the stiffness, i.e. Eigen frequency of each of the devices could be designed close to 0 Hz.

However, several aspects prevent a vibration isolation system having three vibration isolation devices to be designed with a net stiffness, i.e. Eigen frequency, close to zero. For example, the mass of the structure to be supported is usually not perfectly distributed over the three vibration isolation devices and material properties, like Young's modulus, can slightly vary. Also, mechanical parts may have machining tolerances.

Further, external, usually positive stiffnesses, called dynamic links, between the base frame and the isolated structure will also influence the Eigen frequency of the system. Examples of dynamic links are cables, hoses and fibers.

In order to ensure that the net stiffness (the positive stiffness minus negative stiffness) is not lower than zero, which would result in an unstable system, a substantial stiffness margin has to be designed into the vibration isolation system to prevent that due to tolerances within the system, the net stiffness will become negative. However, this substantial stiffness margin has a negative effect on the vibration isolation performance of the vibration isolation device.

SUMMARY

It is desirable to provide a vibration isolation device which is capable of improved vibration isolation performance. Further, it is desirable to provide a lithographic apparatus comprising one or more vibration isolation devices with improved vibration isolation performance.

According to an embodiment of the invention, there is provided a vibration isolation device configured to support a structure, comprising
an air mount having a base part mounted on a base structure and a vibration isolated part, and an inverted pendulum device, wherein a lower end of the inverted pendulum device is mounted on the vibration isolated part of the air mount and an upper end of the inverted pendulum device support the structure to be supported, wherein the vibration isolation device comprises a stiffness adjustment device configured to adjust the stiffness of the inverted pendulum device.

According to an embodiment of the invention, there is provided a lithographic apparatus comprising:

an illumination system configured to condition a radiation beam;

a support constructed to support a patterning device, the patterning device being capable of imparting the radiation beam with a pattern in its cross-section to form a patterned radiation beam;

a substrate table constructed to hold a substrate; and a projection system configured to project the patterned radiation beam onto a target portion of the substrate, wherein the projection system is supported by a support structure, wherein the lithographic apparatus comprises at least one vibration isolation device configured to support the support structure, wherein the at least one vibration isolation device comprises: an air mount having a base part mounted on a reference structure and a vibration isolated part, and an inverted pendulum device, wherein a lower end of the inverted pendulum device is mounted on the vibration isolated part of the air mount and an upper end of the inverted pendulum device supports the support structure, wherein the vibration isolation device comprises a stiffness adjustment device configured to adjust the stiffness of the inverted pendulum device.

According to an embodiment of the invention, there is provided a method to tune a vibration isolation device configured to support a structure, wherein the vibration isolation device comprises:

an air mount having a base part mounted on a base structure and a vibration isolated part, and an inverted pendulum device, wherein a lower end of the inverted pendulum device is mounted on the vibration isolated part of the air mount and an upper end of the inverted pendulum device support the structure to be supported, wherein the vibration isolation device comprises a stiffness adjustment device configured to adjust the stiffness of the inverted pendulum device, wherein the method comprises the steps of:

determining the stiffness of the inverted pendulum device, and adjusting the stiffness of the inverted pendulum device using the stiffness adjusting device on the basis of the determined stiffness of the inverted pendulum device.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
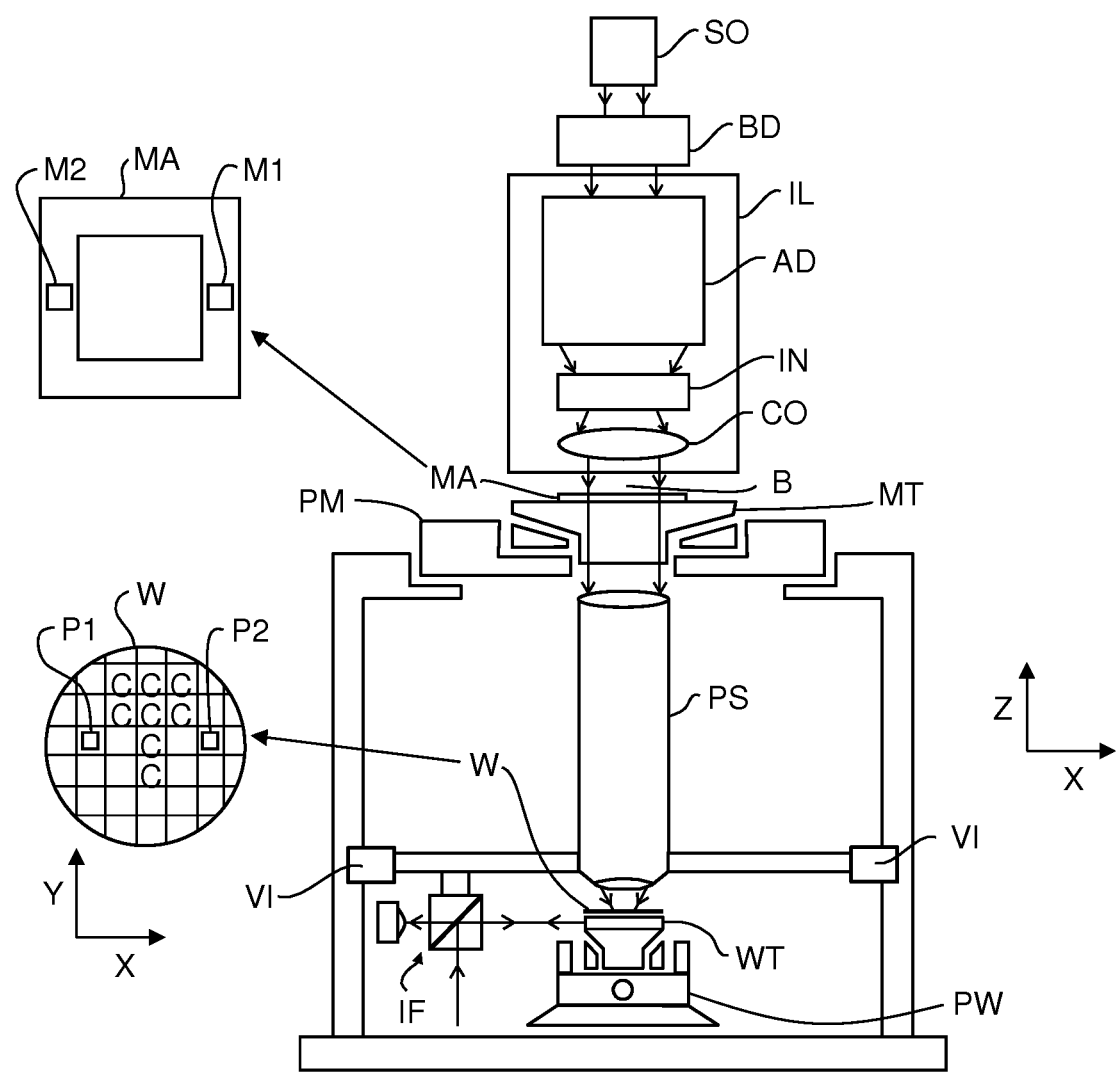
FIG. 1 depicts a lithographic apparatus comprising a substrate stage according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device.

The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In the lithographic apparatus of FIG. 1, it is desirable that certain parts of the lithographic apparatus are isolated from external vibrations. For example, the lithographic apparatus comprises a vibration isolated metrology frame to support the projection system PS. The metrology frame is supported by three vibration isolation devices, schematically indicated in FIG. 1 (two shown).

Figure 2:
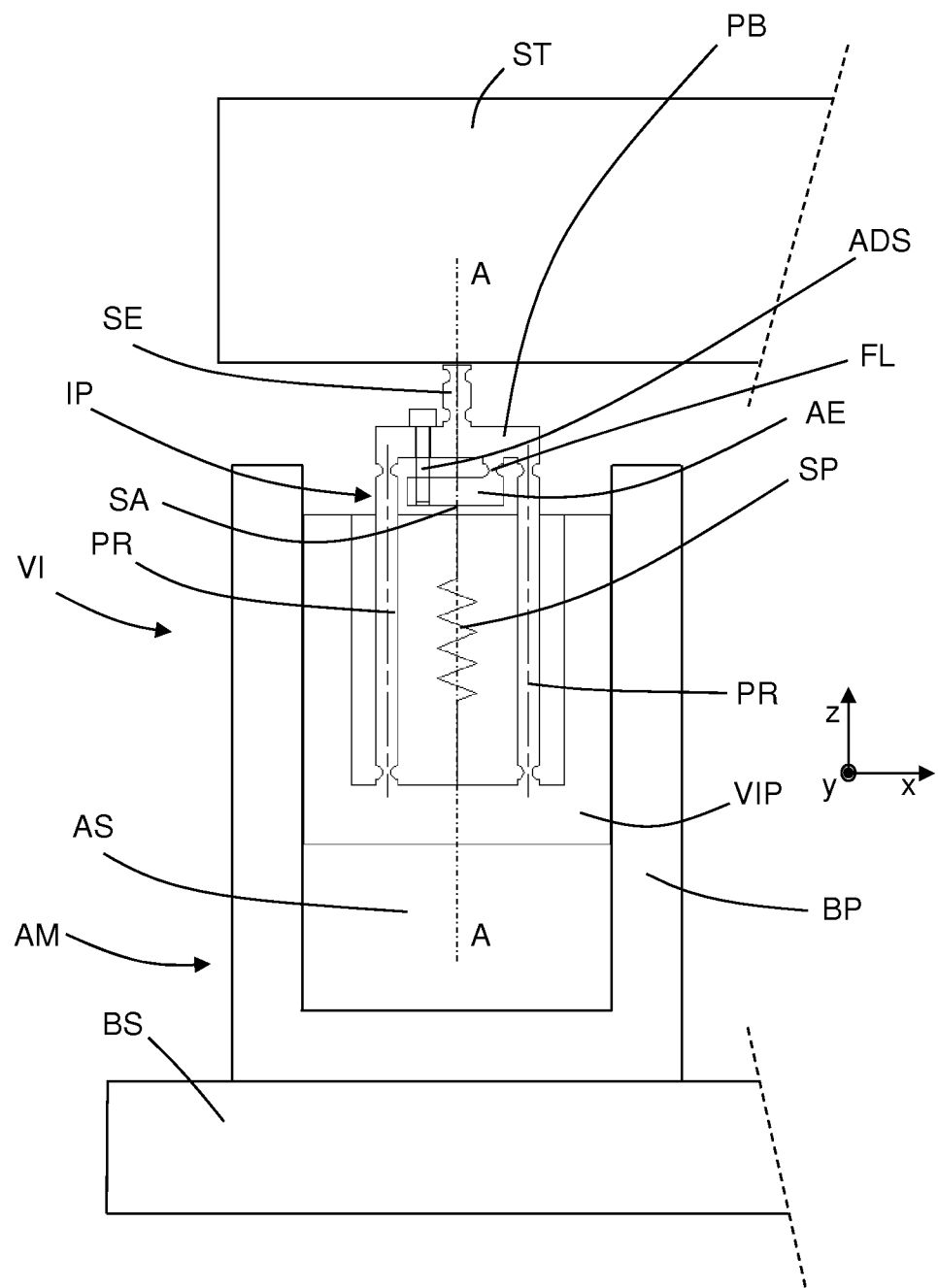
FIG. 2 depicts a first embodiment of a vibration isolation device according to the invention.

FIG. 2 shows a first embodiment of a vibration isolation device VI. The vibration isolation device VI comprises an air mount AM and an inverted pendulum device IP.

The air mount AM comprises a base part BP mounted on a base structure BS, such as a base frame, and a vibration isolated part VIP configured to support, via an inverted pendulum device IP, a structure ST. The structure is for example a metrology frame of the lithographic apparatus to support the projection system PS and reference parts of position sensors.

The vibration isolated part VIP is movably mounted in the base part BP so that it can move in the vertical z-direction with respect to the base part BP. An air space AS containing a volume of air is arranged below the vibration isolated part VIP to support it in the Z-direction. The vibration isolated part VIP and the base part BP thus form an air mount AM to support the structure ST, but at the same time isolate the structure ST from the base structure BS from vibrations in the z-direction. Note that, within the meaning of the present invention, wherever reference is made to an air mount, it will be understood by the skilled person that other types of gas may equally be applied instead of air.

The inverted pendulum device IP comprises a lower end and an upper end. The lower end of the inverted pendulum device IP is mounted on the vibration isolated part VIP of the air mount AM and the upper end of the inverted pendulum device IP supports the structure ST to be supported.

The inverted pendulum device IP is configured to provide flexibility in the directions of the x-y plane and directions of rotation in order to prevent that vibrations in the x-direction and/or y-direction and/or rotations about the x-axis, y-axis and/or z-axis are passed from the base structure BS to the structure ST via the vibration isolation device VI.

The inverted pendulum device IP comprises multiple, for example three or four, pendulum rods PR (two shown) comprising links having a high flexibility in the directions of the x-y plane and/or in directions of rotation about the x-axis, y-axis and z-axis. The pendulum rods PR are distributed evenly around a central axis A-A. A bottom end of each pendulum rod PR is mounted on the vibration isolated part VIP and the upper ends are connected to a pendulum bridge PB. The inverted pendulum device IP further comprises a support element SE arranged between the pendulum bridge PB and the structure ST to support the structure ST at a single location. The support element SE also comprises links with high flexibility in the directions of the x-y plane and/or in directions of rotation about the x-axis, y-axis and z-axis.

The stiffness of the inverted pendulum device IP comprises a negative stiffness and a positive stiffness. The positive stiffness of the inverted pendulum device IP is formed by the stiffness of the inverted pendulum device IP itself, i.e. shape, material, construction, etc. The negative stiffness of the inverted pendulum device IP is formed by the tendency of the inverted pendulum device IP to tip over.

This negative stiffness may be described as the force divided by displacement:

$$c_{neg} = -m*g*\alpha/l*\alpha = -m*g/l,$$

wherein m is the mass supported by the inverted pendulum device IP, g is the gravity constant, α the angle of the inverted pendulum device IP with respect to the z-direction and l the effective length of the inverted pendulum device IP.

The net stiffness, or Eigen frequency, of the inverted pendulum device IP is determined by the positive stiffness minus the negative stiffness of the inverted pendulum device IP.

During design of the inverted pendulum device IP, it is desirable that the net stiffness (Eigen frequency) of the inverted pendulum device IP is as close as possible to 0 Hz to substantially avoid that vibrations in the base structure in x-direction and/or y-direction and/or rotations are passed via the inverted pendulum device IP to the structure ST. However, at the same time it is undesirable that the net stiffness is lower than zero as this would result in an unstable support of the structure.

Disadvantages of such unstable support are for example that the assembly of the lithographic apparatus becomes more complex, possibly requiring the need of additional supports during assembly. Further, if the vibration isolation device VI system is uncontrolled powered down, the inverted pendulum device IP would "fall" sideways, leading to impact forces which are generally undesirable. Moreover, an actuator power is continuously needed to keep the inverted pendulum device IP in the straight up center position.

However, several aspects prevent designing the inverted pendulum device IP with a net stiffness of zero or very close to zero. For example, the mass of het structure is usually not perfectly distributed and the distribution is not exactly known during design. Also, material properties of the parts of the inverted pendulum device IP for example the pendulum rods PR, can vary slightly, like Young's modulus, and mechanical parts may have machining tolerances.

Furthermore, so-called dynamic links, such as cables, hoses and fibers, between the structure ST and the base structure BS or other non-vibration isolated parts of the lithographic apparatus external will also influence the net stiffness frequency of the system.

In addition to the above, it is desirable to use one set of mechanical parts for a set of vibration isolation devices VI to reduce the amount of different parts, assemblies, spare parts and so on in machines. This however also limits the possibility of adapting the design for each specific location and load of the vibration isolation device VI.

In view of the uncertainty resulting from these aspects, it is desirable to deliberately introduce a net stiffness into the inverted pendulum device IP substantially above zero in order to avoid unstable behavior of the inverted pendulum device IP during use.

According to the invention, the vibration isolation device VI comprises a stiffness adjustment device SA configured to adjust the stiffness of the inverted pendulum device IP. Such stiffness adjustment device SA has the advantage that the stiffness of the inverted pendulum device IP can be adjusted after assembly of the lithographic apparatus, for example during calibration.

In the embodiment of FIG. 2, the stiffness adjustment device SA comprises a mechanical spring SP, an adjustable element AE and an adjustment screw ADS. The mechanical spring SP is, in the shown embodiment a helical spring and is mounted coaxial with the central axis A-A to create, with respect to the central axis A-A a symmetrical distribution of a force exerted by the spring SP.

A lower end of the mechanical spring SP is connected to the vibration isolated part VIP and the upper end of the spring SP is connected to the adjustable element AE. The adjustable element AE is mounted at one side with a flexible link FL to the pendulum bridge PB, while the other end is connected to the pendulum bridge PB via the adjustment screw ADS.

By rotation of the adjustment screw ADS, the adjustable element AE can be tilted about the flexible link FL. Since the spring SP is connected to the adjustable element AE, the upper end of the spring SP will be moved together with the tilting movement of the adjustable element AE resulting in a change of the force exerted by the spring SP between the vibration isolated part VIP and the pendulum bridge PB, and thus a change of the force exerted within the inverted pendulum device IP.

As a result of a different force being exerted by the spring SP, the negative stiffness of the inverted pendulum device IP will change. Thus, the adjustable screw ADS provides the possibility to tune the stiffness of the inverted pendulum device IP in order to bring the net stiffness of the inverted pendulum device IP closer to zero.

Any other device or construction to change the force exerted by the spring SP within the inverted pendulum device IP may also be used to provide an inverted pendulum device IP having an adjustable stiffness. It is remarked that a passive damping device may be provided to improve the behavior of the spring SP.

Figure 3:
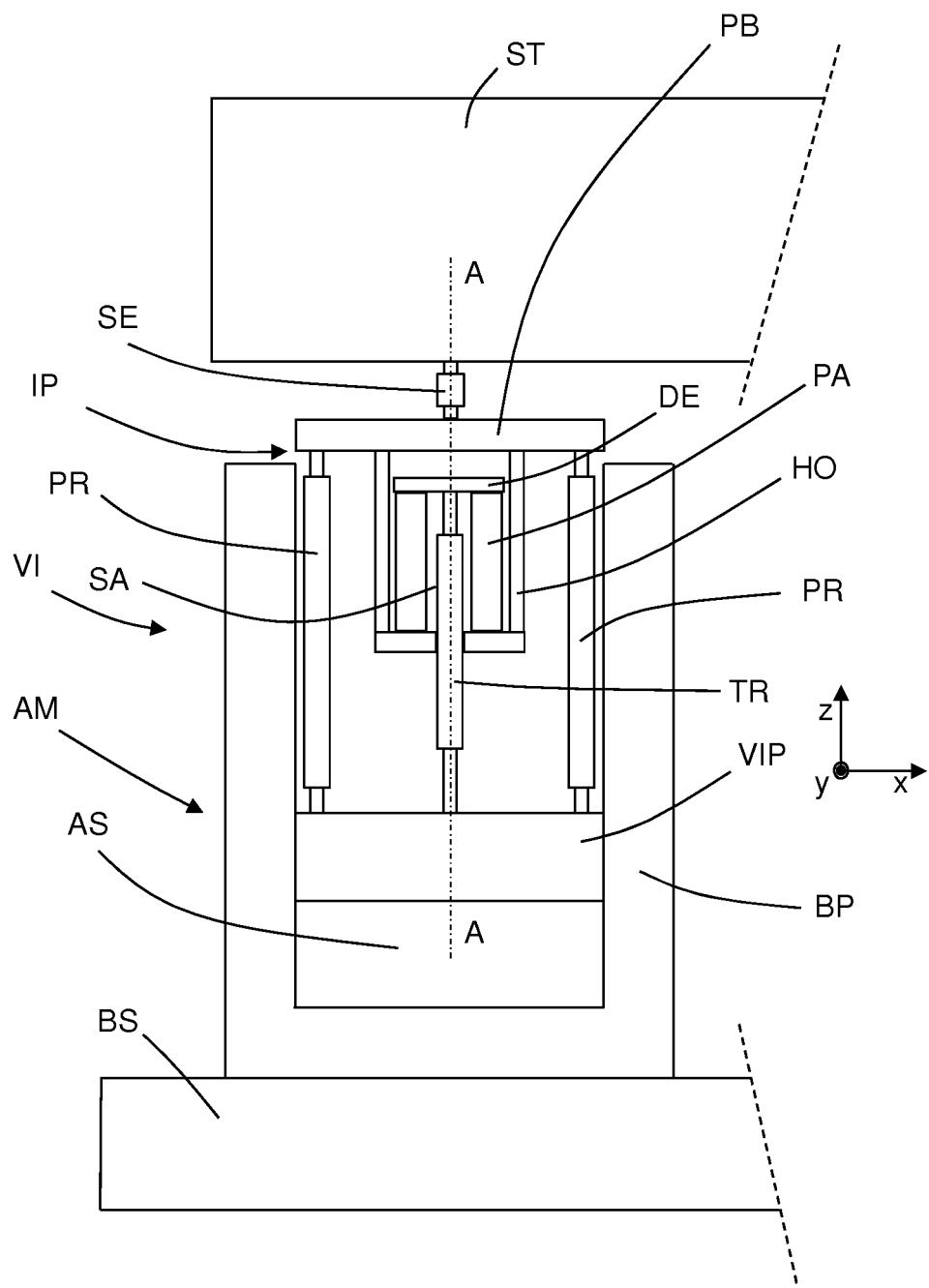
FIG. 3 depicts a second embodiment of a vibration isolation device according to the invention.

FIG. 3 shows a second embodiment of a vibration isolation device VI. The air mount AM of the second embodiment is constructed similar to the air mount AM of FIG. 2. The air mount comprises a base part BP mounted on a base structure BS and a vibration isolated part VIP movably arranged in the base part BP to form an air space AS that functions as a vibration isolation device for vibrations in the z-direction.

The vibration isolation device VI further comprises an inverted pendulum device IP, wherein a lower end of the inverted pendulum device IP is mounted on the vibration isolated part VIP of the air mount AM and an upper end of the inverted pendulum device supports the structure ST to be supported.

The inverted pendulum device IP comprises multiple, for example three or four, pendulum rods PR comprising links having a high flexibility in the directions of the x-y plane and/or in directions of rotation about the x-axis, y-axis and z-axis. The pendulum rods PR are evenly distributed around the central axis A-A. A bottom end of each pendulum rod PR is mounted on the vibration isolated part VIP and the upper ends are connected to a pendulum bridge PB. The inverted pendulum device IP further comprises a support element SE arranged between the pendulum bridge PB and the structure ST to support the structure ST at a single location. The support element SE also comprises links with high flexibility in the directions of the x-y plane and/or in directions of rotation about the x-axis, y-axis and z-axis.

The inverted pendulum device IP comprises a stiffness adjustment device SA. The stiffness adjustment device SA is configured to exert a force within the inverted pendulum device IP to adjust a stiffness of the inverted pendulum device IP. To evenly distribute the force within the inverted pendulum device IP, the stiffness adjustment device SA is arranged centrally on the central axis A-A.

The stiffness adjustment device SA comprises a housing HO mounted at the bottom surface of the pendulum bridge. In the housing HO, a ring shaped multi stack piezo actuator PA is provided. The housing HO is configured to support the bottom side of the piezo actuator PA.

The stiffness adjustment device SA further comprises a tension rod TR and a disc element DE. A lower end of the tension rod TR is connected to the vibration isolated part VIP and the upper end of the tension rod TR is connected to the top side of the piezo actuator PA via the disc element DE.

Actuation of the piezo actuator PA will result in an upwards movement of the disc element DE and therewith an upwards movement of the upper end of the tension rod TR. As a result, a force will be introduced into the tension rod TR which will have an effect on the stiffness of the inverted pendulum device IP. Thus, the force exerted by the piezo actuator PA on the tension rod TR can be adjusted in order to adjust the stiffness of the inverted pendulum device IP. This provides the possibility to tune the stiffness of the inverted pendulum device IP in dependence of the actual situation of the vibration isolation device VI.

The advantage of the use of the piezo actuator PA, instead of the adjustable screw ADS of the embodiment in FIG. 2, is that the stiffness of the inverted pendulum device IP can be adjusted without access to the vibration isolation device VI. This is in particular useful when the isolation device VI is badly accessible, for example in vacuum systems. Further, since the force exerted by the piezo actuator PA can continuously be adjusted, the stiffness of the inverted pendulum device IP can also continuously be adjusted. For example, it is possible to adjust the stiffness of the inverted pendulum device IP as a function of the position of the inverted pendulum device IP with respect to the central axis A-A. In such embodiment, a sensor may be provided to measure the actual the position of the inverted pendulum device IP with respect to the central axis A-A.

It is remarked that instead of the ring shaped multi stack piezo actuator PA also other types of, preferably actively controlled, actuators can be used, such as a solid piezo actuator, a pneumatic actuator, an electromagnetic actuator, etc.

Figure 4:
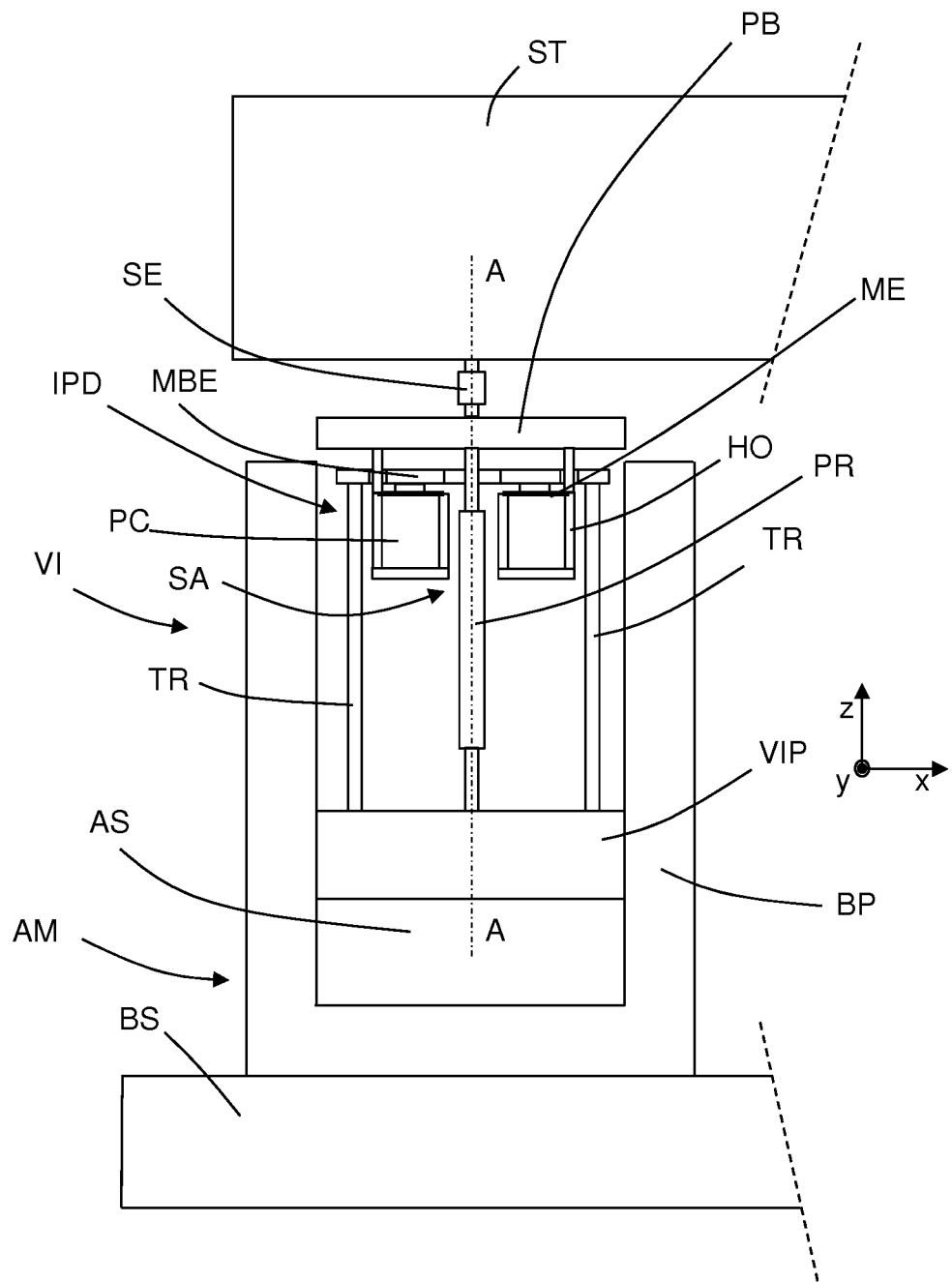
FIG. 4 depicts a third embodiment of a vibration isolation device according to the invention.

FIG. 4 shows a third embodiment of a vibration isolation device VI. The air mount AM of the third embodiment is substantially the same as the air mount AM of FIG. 2.

The vibration isolation device VI of the third embodiment also comprises an inverted pendulum device IP. The inverted pendulum device IP comprises a single pendulum rod PR comprising links having a high flexibility in the directions of the x-y plane and/or in directions of rotation about the x-axis, y-axis and z-axis. The pendulum rod PR is arranged coaxial with the central axis A-A of the vibration isolation device VI. A bottom end of the pendulum rod PR is connected to the vibration isolated part VIP and the upper end is connected to a pendulum bridge PB.

A stiffness adjustment device SA is provided to adjust the stiffness of the inverted pendulum device IP in order to tune the vibration isolation device VI.

The stiffness adjustment device SA comprises a housing HO mounted at a bottom surface of the pendulum bridge PB. The housing HO comprises an annular pressurized fluid chamber PC configured to receive an amount of pressurized fluid, for instance pressurized air. The top end of the pressurized fluid chamber PC is formed by a ring-shaped membrane ME, for instance made of steel or rubber. The membrane ME can move in z-direction in dependence of the pressure of the pressurized fluid within the pressurized fluid chamber PC. The stiffness adjustment device SA is thus based on a pneumatic or hydraulic actuator.

A bridge element MBE is mounted on the membrane ME and tension rods TR are mounted between the bridge element MBE and the vibration isolated part VIP.

The stiffness adjustment device SA can be used as follows to adjust the stiffness of the inverted pendulum device IP. By increasing the pressure in the pressurized fluid chamber PC, the membrane ME will be forced upwards. As a result, the bridge element MBE will also be forced upwards.

However, the tension rods TR will prevent upwards movement of the bridge element MBE, which results in a force being introduced into the tension rods TR and therewith into the inverted pendulum device IP. This force will adjust the stiffness of the inverted pendulum device IP and can therefore be used to tune the stiffness as described above with respect to the embodiments of FIGS. 2 and 3.

An advantage of the stiffness adjustment device SA having a pneumatic or hydraulic actuator is that the force exerted by the actuator, and therewith the stiffness of the inverted pendulum device IP can be adjusted without the need of direct access to the vibration isolation device VI.

Another advantage is that the pressure in the pressurized fluid chamber PC can be actively controlled, for example in dependence of a position of the inverted pendulum device IP. However, a manually adjustable pressure setting, for example by an adjustable pressure reducing valve may also be applied.

Another advantage of in particular a pneumatic actuator is that the pneumatic actuator has a low stiffness and therefore a low contribution in the additional positive stiffness introduced into the inverted pendulum device IP.

Figure 5:
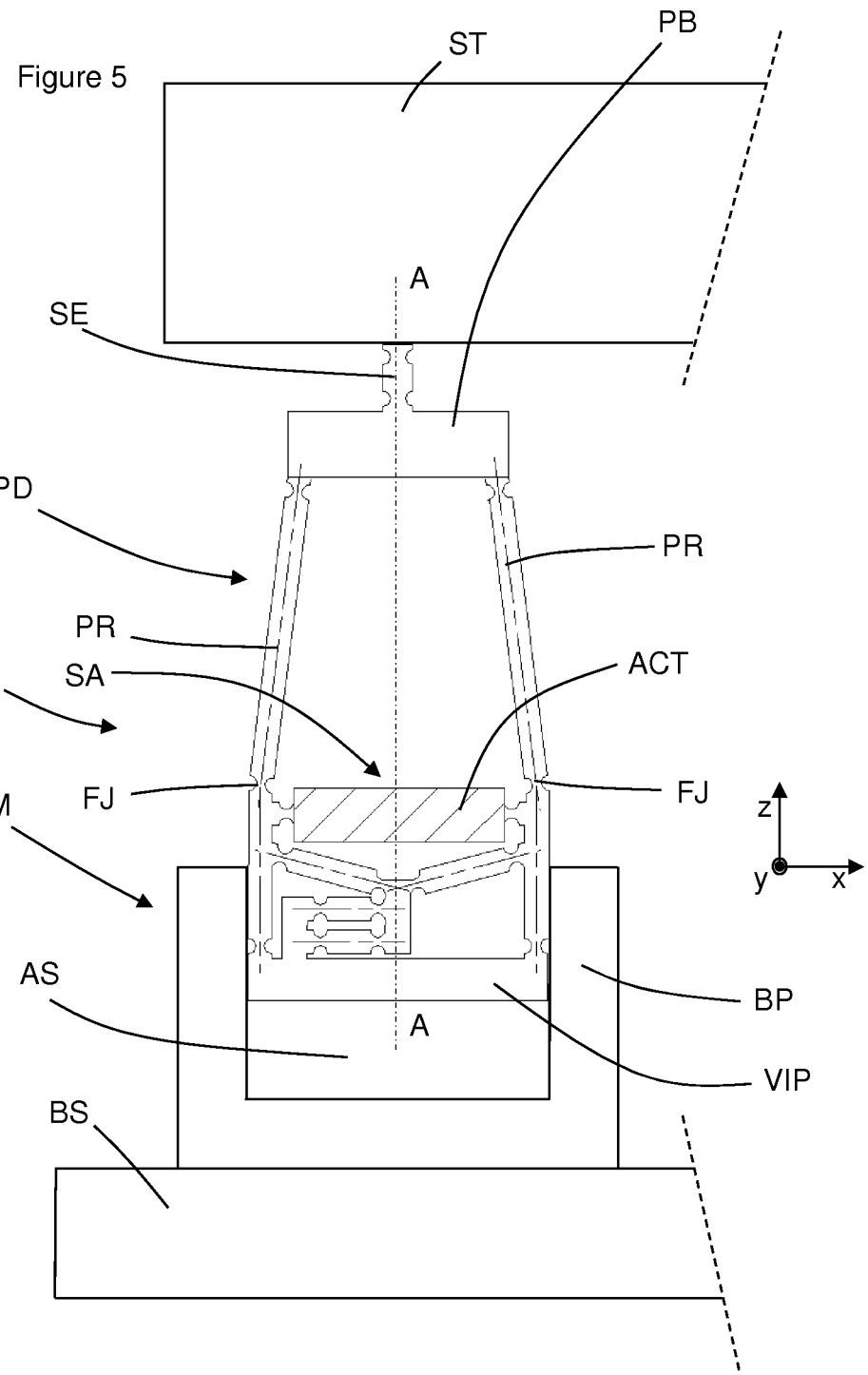
FIG. 5 depicts a fourth embodiment of a vibration isolation device according to the invention.

FIG. 5 shows a fourth embodiment of a vibration isolation device VI. Again, the air mount AM of the fourth embodiment is configured similarly to the air mount AM of FIG. 2.

The vibration isolation device VI also comprises an inverted pendulum device IP. The inverted pendulum device IP comprises multiple pendulum rods PR (two shown) comprising links having a high flexibility in the directions of the x-y plane and/or in directions of rotation about the x-axis, y-axis and z-axis.

The pendulum rods PR are evenly distributed about the central axis A-A of the vibration isolation device VI. A bottom end of each pendulum rod PR is mounted on the vibration isolated part VIP of the air mount AM and the upper end is connected to a pendulum bridge PB.

Similarly, to the embodiments of FIGS. 2, 3, and 4, the stiffness of the inverted pendulum device IP is adjustable in order to make tuning of the stiffness of the inverted pendulum device IP possible. The adjustment of the stiffness is however based on another principle.

As explained above, the negative stiffness of the inverted pendulum device IP is dependent on the effective length of the inverted pendulum device IP, i.e. the distance of the support element SE with respect to the vibration isolated part VIP. Thus, by adjusting the effective length of the inverted pendulum device IP, the stiffness can be adjusted.

In the embodiment of FIG. 5, the effective length of the inverted pendulum device IP can be adjusted by bending of the pendulum rods PR at the flexible joints FJ. For this reason, the inverted pendulum device IP comprises an actuator ACT, for example a piezo actuator or electromagnetic actuator.

The pendulum rods PR in FIG. 5 are non-parallel with respect to each other to create a virtual hinge that defines a radius of movement at the top end of the support element SE. The distance between the flexible joints FJ influences this radius of the virtual hinge. Increasing the distance will result in a smaller radius of the virtual hinge, and therefore in a smaller effective length of the inverted pendulum device IP, while decreasing the distance will result in a larger radius of the virtual hinge, and therefore in a larger effective length of the inverted pendulum device IP.

The actuator ACT may be actuated to push the pendulum rods PR away from each other, which results in an increased bend angle at the flexible joints FJ. Such increased bend angle at the flexible joints FJ will result in a smaller effective length, i.e. a smaller distance between support element SE and vibration isolated part VIP.

Correspondingly, the actuator ACT may be actuated to pull the pendulum rods PR towards each other, which results in an decreased bend angle at the flexible joints FJ. Such decreased bend angle, at the flexible joints FJ will result in a larger effective length, i.e. a larger distance between support element SE and vibration isolated part VIP.

In the embodiment of FIG. 5, a virtual hinge is formed by non-parallel pendulum rods PR. The advantage of such virtual hinge is that pendulum rods of relatively small length can be used to create a relatively large effective length, or vice versa. In an alternative embodiment parallel pendulum rods PR may be used.

It is remarked that instead of a actively controlled actuator ACT, also a manual adjustment device such as a screw may be used to bend the pendulum rods PR at the flexible joints in order to adjust the effective length of the inverted pendulum device IP.

As described above, the stiffness adjustment device SA can be used to tune the vibration isolation device VI, in particular the stiffness of the inverted pendulum device IP. This tuning may comprise the steps of determining the stiffness of the inverted pendulum device IP and adjusting the stiffness of the inverted pendulum device IP using the stiffness adjusting device SA on the basis of the determined stiffness.

In an embodiment, the stiffness of the inverted pendulum device IP is made, during design of the vibration isolation device VI relatively high, i.e. substantially above zero, and the stiffness adjusting device SA is used to bring the net stiffness of the inverted pendulum device IP closer to zero. This tuning of the stiffness is preferably carried out after assembly of the lithographic apparatus, for example during a calibration process.

In an embodiment of a vibration isolation device VI comprising an actively controlled stiffness adjusting device SA, such as the embodiments of FIGS. 3, 4 and 5, the tuning method may comprise active tuning of the stiffness of the inverted pendulum device IP. For example, adjusting the stiffness of the inverted pendulum device IP may be performed in dependence of a position of the inverted pendulum device IP with respect to a vertical axis. Hereinabove, different embodiments of a vibration isolation device VI for use in a vibration isolation system to support a metrology frame of a lithographic apparatus are described. Such vibration isolation system or vibration isolation device may also be used for other applications, for example in a track, i.e. a tool that typically applies a layer of resist to a substrate and develops the exposed resist, a metrology tool and/or an inspection tool, such as a ASML Yieldstar inspection tool, or in any other device or apparatus in which vibration isolation of at least a part of the device or apparatus is desirable.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out below.

What is claimed is:

1. A vibration isolation device configured to support a structure, the vibration isolation device comprising:
   an air mount having a base part mounted on a base structure and having a vibration isolated part; and
   an inverted pendulum device, wherein a lower end of the inverted pendulum device is mounted on the vibration isolated part of the air mount and an upper end of the inverted pendulum device supports the structure to be supported via a pendulum bridge, and
   wherein the vibration isolation device comprises a stiffness adjustment device configured to adjust a stiffness of the inverted pendulum device.

2. The vibration isolation device of claim 1, wherein the inverted pendulum device has a negative stiffness and a positive stiffness, and wherein the stiffness adjustment device is configured to one of increase the negative stiffness, decrease the positive stiffness, and increase the negative stiffness and decrease the positive stiffness.

3. The vibration isolation device of claim 1, wherein the stiffness adjustment device comprises a force exerting device configured to exert a force within the inverted pendulum device.

4. The vibration isolation device of claim 3, wherein the force exerting device is configured to exert an adjustable force.

5. The vibration isolation device of claim 3, wherein the force exerting device is one of an adjustable spring, a piezo actuator, a pneumatic actuator and an electromagnetic actuator.

6. The vibration isolation device of claim 3, wherein the inverted pendulum device comprises a single pendulum rod, and wherein the force exerting device is configured to exert forces evenly distributed around a central axis of the single pendulum rod.

7. The vibration isolation device of claim 3, wherein the inverted pendulum device comprises multiple pendulum rods arranged equally about a central axis, wherein the force exerting device is configured to exert a force coaxial with the central axis.

8. The vibration isolation device of claim 1, wherein the stiffness adjustment device comprises a mechanical spring and a movable adjustment element configured to adjust a force exerted by the spring within the inverted pendulum device.

9. The vibration isolation device of claim 1, wherein the inverted pendulum device comprises multiple pendulum rods that have a combined effective length, and wherein the stiffness adjustment device is configured to adjust the combined effective length in order to adjust the stiffness of the inverted pendulum device.

10. A lithographic apparatus comprising:
   an illumination system configured to condition a radiation beam;
   a support constructed to support a patterning device, the patterning device being capable of imparting a pattern to a cross-section of the radiation beam to form a patterned radiation beam;
   a substrate table constructed to hold a substrate; and
   a projection system configured to project the patterned radiation beam onto a target portion of the substrate, wherein the projection system is supported by a support structure,
   wherein the lithographic apparatus comprises at least one vibration isolation device configured to support the support structure, wherein the at least one vibration isolation device comprises:
   an air mount having a base part mounted on a reference structure and a vibration isolated part, and
   an inverted pendulum device, wherein a lower end of the inverted pendulum device is mounted on the vibration isolated part of the air mount and an upper end of the inverted pendulum device supports the support structure via a pendulum bridge, and
   wherein the vibration isolation device comprises a stiffness adjustment device configured to adjust the stiffness of the inverted pendulum device.

11. A method of tuning a vibration isolation device having an inverted pendulum device and a negative stiffness adjusting device, comprising the steps of:
   determining a determined initial negative stiffness of the inverted pendulum device, the inverted pendulum device including a pendulum bridge; and
   adjusting an operational negative stiffness of the inverted pendulum device using the stiffness adjusting device on the basis of the determined initial negative stiffness of the inverted pendulum device.

12. The method of claim 11, wherein the step of adjusting the operational stiffness of the inverted pendulum device is performed in dependence of a position of the inverted pendulum device with respect to a vertical axis.

13. A vibration isolation system configured to support a structure, the vibration isolation system comprising:
   a first vibration isolation device configured to support the structure at a first location, the first vibration isolation device comprising a first air mount having a first base part mounted on a base structure and having a first vibration isolated part and a first inverted pendulum device, a lower end of the first inverted pendulum device being mounted on the first vibration isolated part of the first air mount and an upper end of the first inverted pendulum device supports the structure to be supported via a first pendulum bridge, the first vibration isolation device also comprising a first stiffness adjustment device configured to adjust a first stiffness of the first inverted pendulum device; and a second vibration isolation device configured to support the structure at a second location, the second vibration isolation device comprising a second air mount having a second base part mounted on the base structure and having a second vibration isolated part and a second inverted pendulum device, a lower end of the second inverted pendulum device being mounted on the second vibration isolated part of the second air mount and an upper end of the second inverted pendulum device supports the structure to be supported via a second pendulum bridge, the second vibration isolation device also comprising a second stiffness adjustment device configured to adjust a second stiffness of the second inverted pendulum device.

14. The vibration isolation system of claim 13, further comprising:

a third vibration isolation device configured to support the structure at a third location, the third vibration isolation device comprising a third air mount having a third base part mounted on the base structure and having a third vibration isolated part and a third inverted pendulum device, a lower end of the third inverted pendulum device being mounted on the third vibration isolated part of the third air mount and an upper end of the third inverted pendulum device supports the structure to be supported, the third vibration isolation device also comprising a third stiffness adjustment device configured to adjust a third stiffness of the third inverted pendulum device.

15. A vibration isolation device configured to support a structure, the vibration isolation device comprising:

an air mount having a base part mounted on a base structure and having a vibration isolated part; and an inverted pendulum device, wherein a lower end of the inverted pendulum device is mounted on the vibration isolated part of the air mount and an upper end of the inverted pendulum device supports the structure to be supported, and wherein the vibration isolation device comprises a stiffness adjustment device configured to adjust a stiffness of the inverted pendulum device, the stiffness adjustment device comprising an actuator and at least one tension rod between the vibration isolated part and the actuator, and wherein the actuator is configured to exert a force on the at least one tension rod.

16. A vibration isolation device configured to support a structure, the vibration isolation device comprising:

an air mount having a base part mounted on a base structure and having a vibration isolated part; and an inverted pendulum device, wherein a lower end of the inverted pendulum device is mounted on the vibration isolated part of the air mount and an upper end of the inverted pendulum device supports the structure to be supported, the inverted pendulum device comprising multiple pendulum rods that have a combined effective length, the multiple pendulum rods having a flexible joint in a middle part, the flexible joint being configured to allow bending to adjust the combined effective length, and wherein the vibration isolation device comprises a stiffness adjustment device configured to adjust the combined effective length in order to adjust a stiffness of the inverted pendulum device, the stiffness adjustment device comprising an actuator to exert a bending force on the flexible joint.

* * * * *